US 6,480,387 B1

(12) United States Patent
Lee et al.

(10) Patent No.: US 6,480,387 B1
(45) Date of Patent: Nov. 12, 2002

(54) HEAT SINK ASSEMBLY

(75) Inventors: Tsung-Lung Lee, Tu-Chen (TW); Cheng-Tien Lai, Tu-Chen (TW); Zili Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/099,826

(22) Filed: Mar. 14, 2002

(51) Int. Cl.[7] .................................................. H05H 7/20
(52) U.S. Cl. ...................... 361/704; 257/719; 361/707; 361/710; 361/719; 24/453; 165/80.3
(58) Field of Search ................... 24/297, 508, 457–458, 24/453; 165/80.2, 80.3, 185; 174/16.3; 257/718–719, 726–727, 706–707, 712–713; 361/690, 704, 707, 709–710, 715, 719–721

(56) References Cited

U.S. PATENT DOCUMENTS

| | | | | |
|---|---|---|---|---|
| 5,590,026 A | * | 12/1996 | Warren et al. .............. 361/704 |
| 5,603,374 A | * | 2/1997 | Wu ............................. 165/80.3 |
| 5,757,621 A | * | 5/1998 | Patel ........................... 361/719 |
| 6,055,159 A | * | 4/2000 | Sun .............................. 361/704 |
| 6,067,230 A | * | 5/2000 | Ashida et al. ............... 361/704 |
| 6,307,748 B1 | * | 10/2001 | Lin et al. ..................... 361/704 |

* cited by examiner

Primary Examiner—Gregory Thompson
(74) Attorney, Agent, or Firm—Wei Te Chung

(57) ABSTRACT

A heat sink assembly includes a heat sink (10), a plurality of standoffs (20), and a plurality of springs (40). The heat sink includes a base (12) defining a plurality of through apertures (16). Each standoff includes a head (24), and a body (22) extending through a corresponding through aperture. The springs are placed over the corresponding bodies and located between the heads and the base. The body has a hollow part (26) for fixedly receiving a bolt (45). The hollow part includes an expandable portion (28) at a bottom end thereof, a smooth guiding portion (31) above the expandable portion, and a threaded portion (33) above the guiding portion. The guiding portion guides the bolt in the standoff to facilitate the bolt engaging in the threaded portion. The expandable portions are expanded to thereby combine the heat sink, standoffs and springs as a single unit.

16 Claims, 4 Drawing Sheets

HEAT SINK ASSEMBLY

BACKGROUND OF THE INVENTION

1. Field of the Invention

The present invention relates to heat sink assemblies, and particularly to heat sink assemblies incorporating spring-loaded standoffs.

2. Related Art

Computer electronic devices such as central processing units (CPUs) frequently generate large amounts of heat, which can destabilize operation and cause damage. A heat sink placed in thermal contact with an electronic device transfers heat from the electronic device through conduction.

U.S. Pat. No. 5,757,621 discloses a conventional heat sink assembly for attachment to a motherboard. The heat sink assembly comprises a heat sink, a plurality of top screws, a plurality of bottom screws, a plurality of standoffs, a plurality of springs and a plurality of pads. Each standoff comprises a shoulder, and a neck extending upwardly from the shoulder.

In assembly, the necks of the standoffs are extended through a base of the heat sink, and the shoulders abut the motherboard. The bottom screws are threaded through the shoulders into the necks. The springs are then slid over the necks to abut the base. The pads are placed on the springs. The top screws are threaded into the necks and compress the springs to press the heat sink onto an integrated circuit on the motherboard.

Nevertheless, the screws cannot be guided into the standoffs before the screws are threadedly engaged with threads in the standoffs. This results in undue inconvenience when threading the screws into the standoffs. Furthermore, there is an excessive number of components in the assembly, thereby inflating costs and rendering the assembly process unduly complicated.

SUMMARY OF THE INVENTION

Accordingly, an object of the present invention is to provide a heat sink assembly incorporating standoffs which can easily and conveniently guide bolts in the standoffs.

To achieve the above-mentioned object, a heat sink assembly in accordance with the present invention comprises a heat sink, a plurality of standoffs, and a plurality of springs. The heat sink comprises a base defining a plurality of through apertures. Each standoff comprises a body extending through a corresponding through aperture, and a head formed on a top end of the body. The springs are placed over the corresponding bodies and located between the heads and the base. The body comprises a hollow part for fixedly receiving a bolt. The hollow part comprises an expandable portion at a bottom end thereof, a smooth guiding portion above and adjacent the expandable portion, and a threaded portion above and adjacent the guiding portion. The guiding portion guides the bolt in the standoff to facilitate the bolt engaging in the threaded portion. The expandable portions are expanded to thereby combine the heat sink, standoffs and springs as a single unit.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
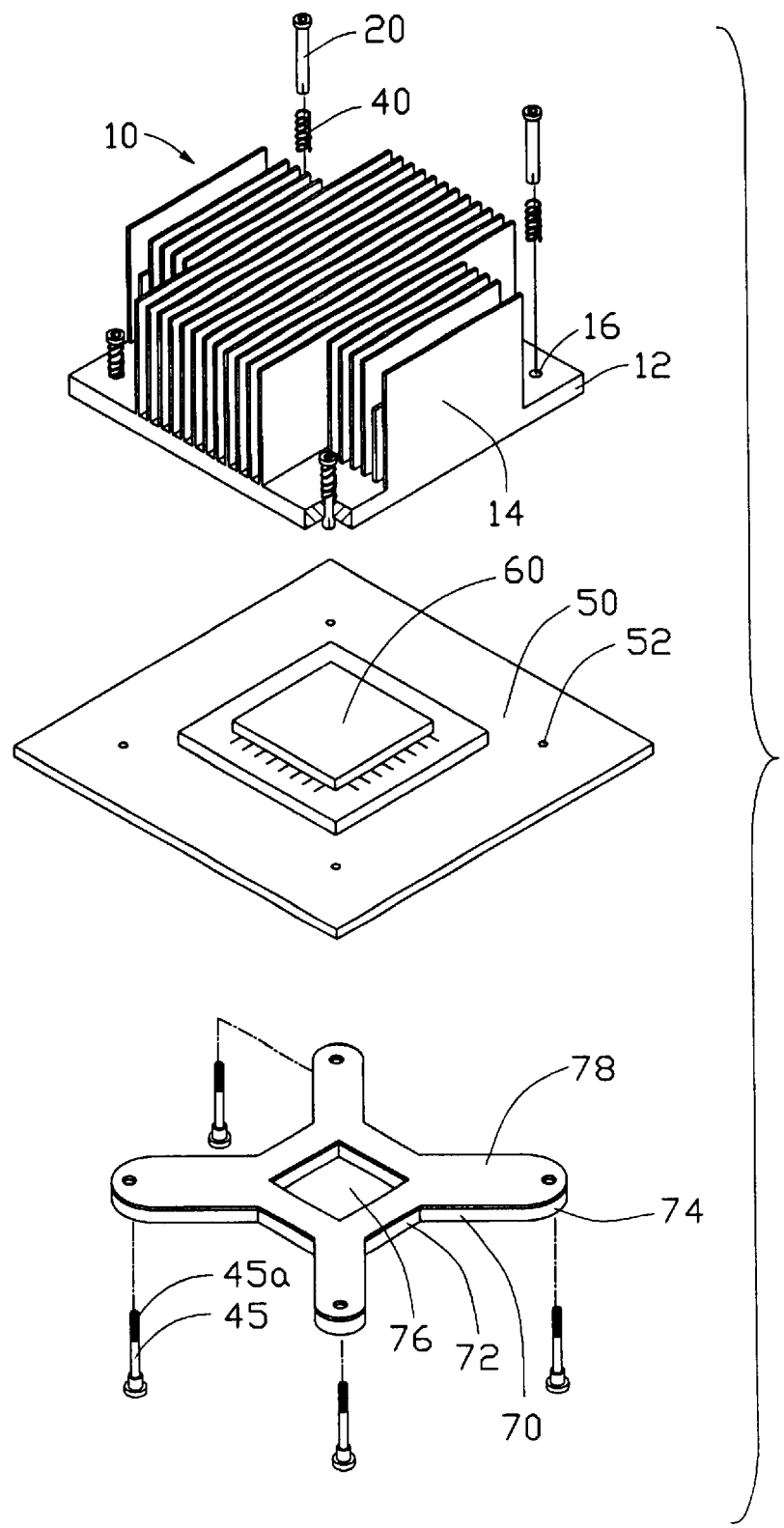
FIG. 1 is an exploded perspective view of a heat sink assembly in accordance with the present invention, together with a motherboard, a CPU and a back plate.

FIG. 1 of the attached drawings shows a heat sink assembly in accordance with the present invention, together with a motherboard 50, a central processing unit (CPU) 60 attached on the motherboard 50, and a back plate 70.

The motherboard 50 defines four first through apertures 52 that surround the CPU 60. The back plate 70 is made of metal, and comprises a rectangular central portion 72 and two pairs of fingers 74. The fingers 74 extend radially outwardly from corresponding corners of the central portion 72. A rectangular opening 76 is defined in the central portion 72, for improving elastic deformability of the back plate 70 and reducing a weight of the back plate 70. A thin pad 78 is secured on the back plate 70. The pad 78 is made of insulative elastic material so that when the back plate 70 is secured to the motherboard 50, the back plate 70 is electrically isolated from the motherboard 50 by the pad 78. Furthermore, the pad 78 functions as a cushion between the back plate 72 and the motherboard 50 to protect the motherboard 50 from being damaged by the back plate 70.

The heat sink assembly comprises a heat sink 10, four standoffs 20, four springs 40, and four bolts 45. The heat sink 10 comprises a rectangular base 12, and a plurality of fins 14 extending upwardly from the base 12. Four second through apertures 16 are respectively defined at four corners of the base 12, corresponding to the first through apertures 52 of the motherboard 50. Each bolt 45 comprises an upper threaded part 45a.

Figure 2:
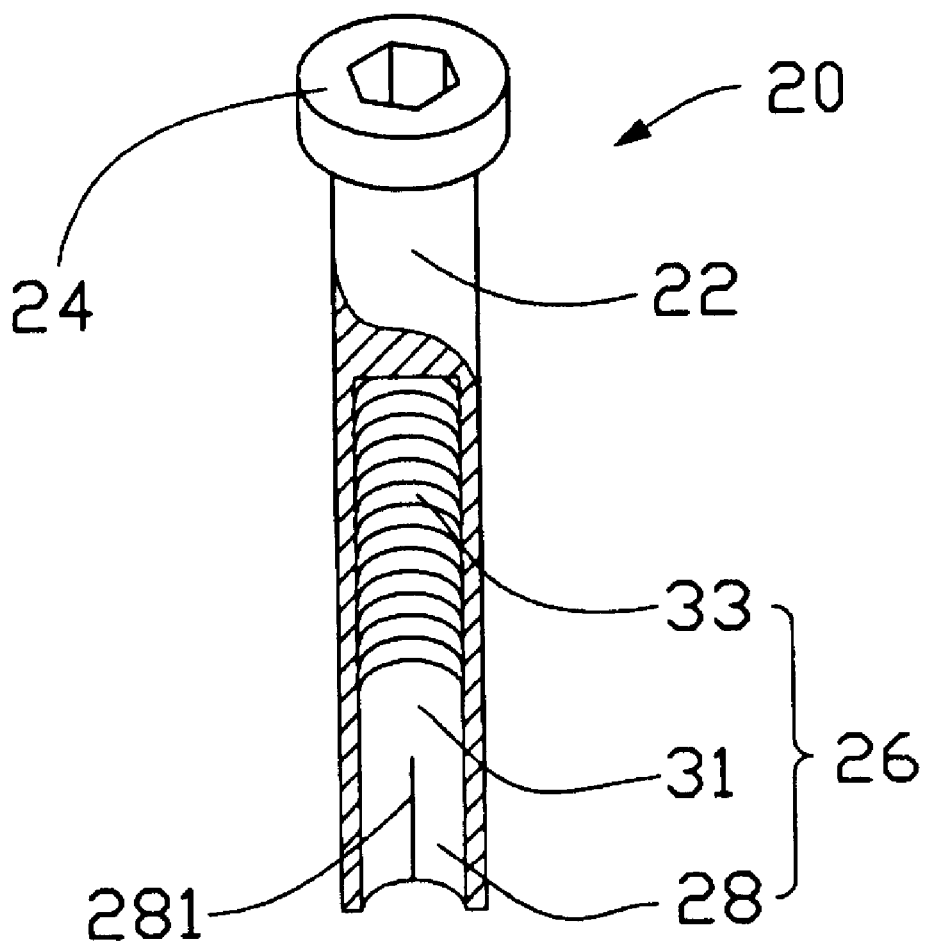
FIG. 2 is a perspective cutaway view of one standoff of the heat sink assembly of FIG. 1.

Referring to FIG. 2, each standoff 20 comprises a body 22 and a head 24 formed on a top end of the body 22. The body 22 comprises a hollow part 26 spanning middle and bottom portions thereof. The hollow part 26 comprises an expandable portion 28 at a bottom end thereof, a smooth guiding portion 31 above and adjacent the expandable portion 28, and a threaded portion 33 above and adjacent the guiding portion 31. The expandable portion 28 longitudinally defines a plurality of evenly-spaced slits 281 in a wall of the hollow part 26. The threaded portion 33 has an internal thread formed therein.

Figure 3:
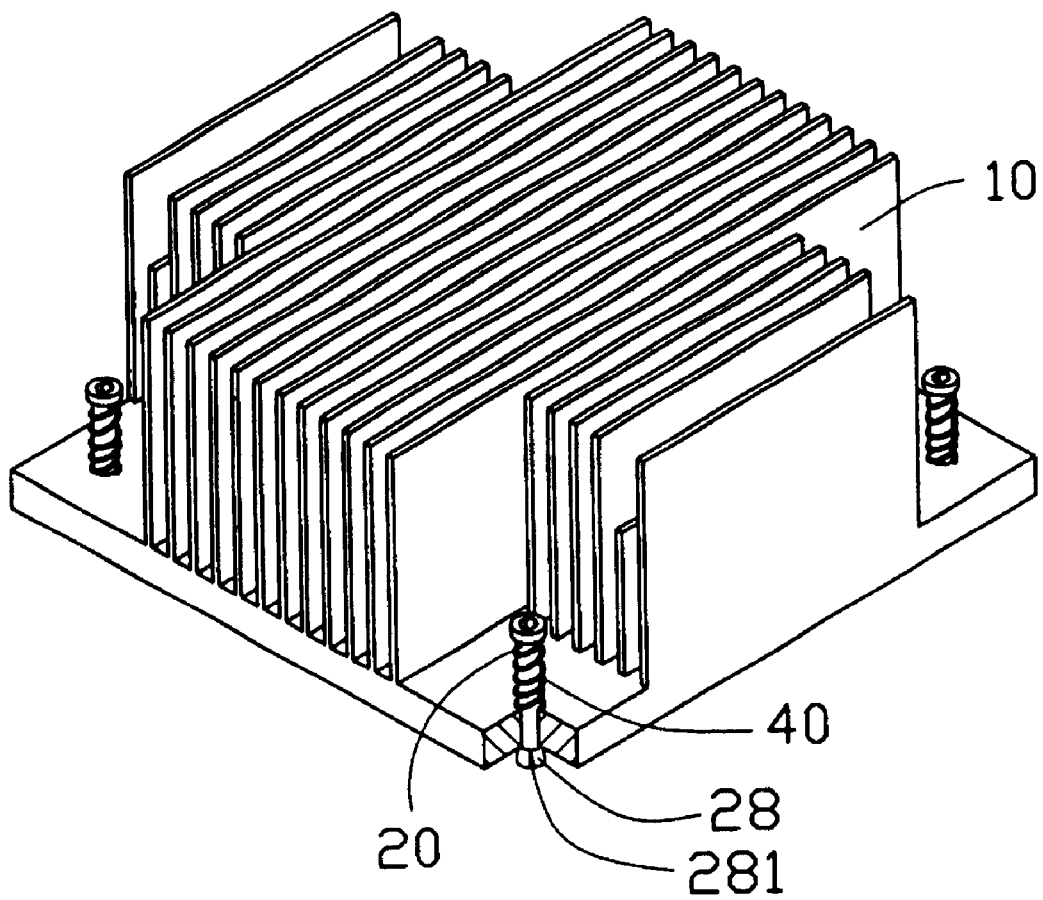
FIG. 3 is a pre-assembled view of a heat sink, springs and standoffs of the heat sink assembly of FIG. 1.
Figure 4:
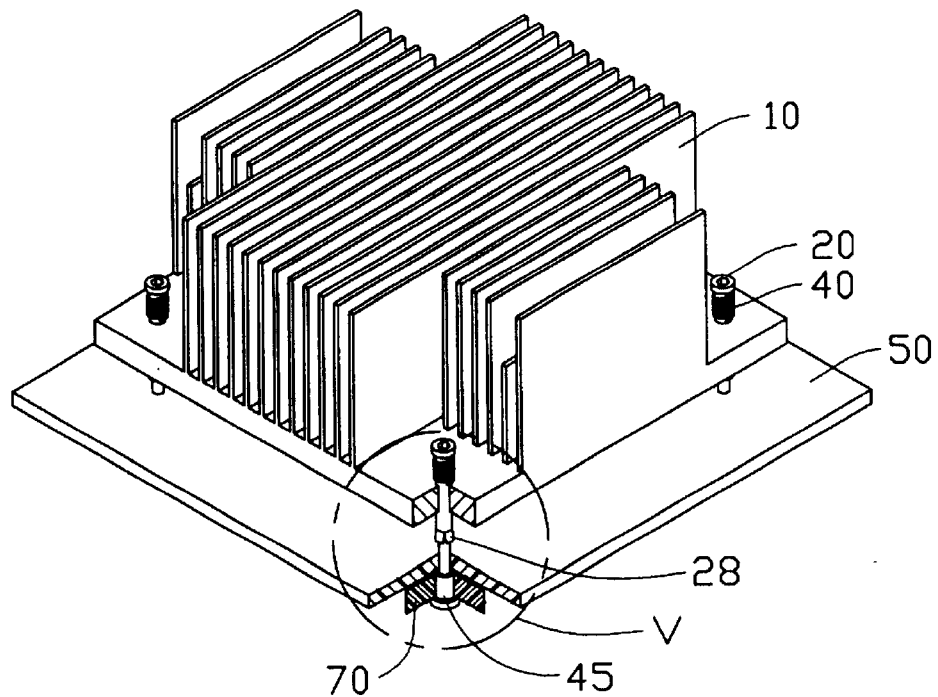
FIG. 4 is a fully assembled view of FIG. 1, partly cut away for better illustration.
Figure 5:
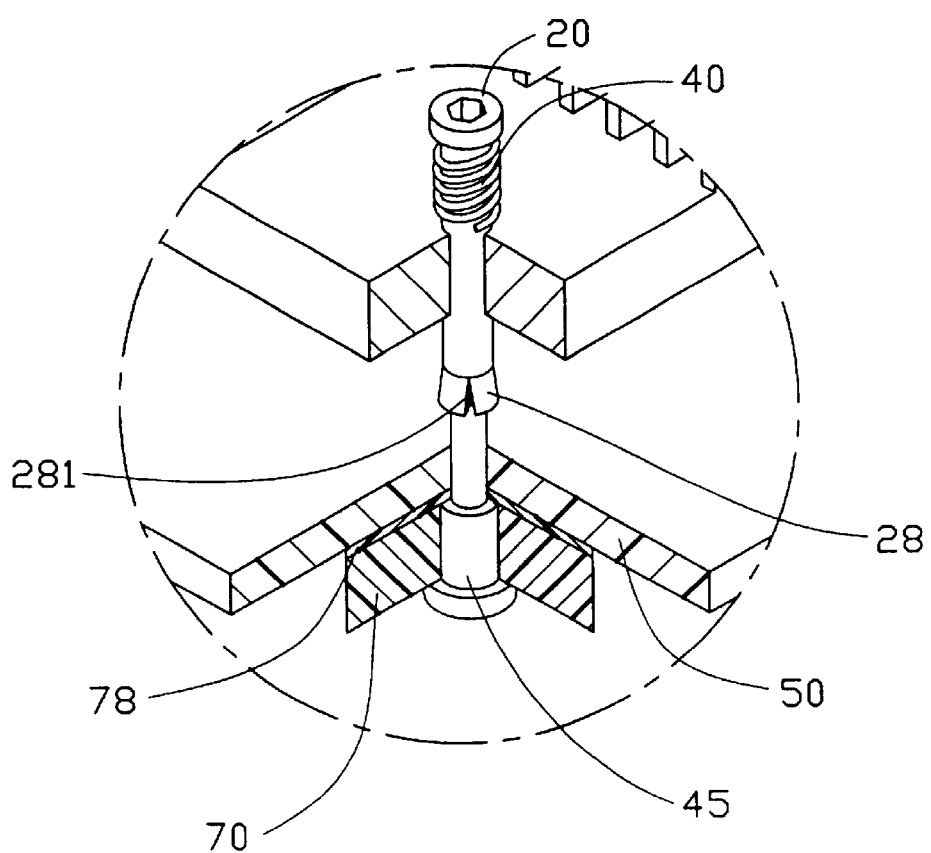
FIG. 5 is an enlarged view of a circled portion V of FIG. 4.

Referring also to FIGS. 3–5, in assembly, the springs 40 are placed over the bodies 22 of the standoffs 40. The bodies 22 of the standoffs 20 are extended downwardly through the second through apertures 16 of the heat sink 10. The springs 40 are thus located between the heads 24 of the standoffs 20 and the base 12 of the heat sink 10. The expandable portions 28 of the standoffs 20 are exposed below an underside of the base 12. The expandable portions 28 are expanded outwardly by inserting a tool (not shown) successively into each expandable portion 28. This expanding operation is well known by those skilled in the art. The standoffs 20 are thereby securely attached to the heat sink 10, and the base 12 is sandwiched between the expandable portions 28 and the springs 40. The heat sink 10, standoffs 20 and springs 40 are thus pre-assembled as a single unit. The bolts 45 are fixedly engaged in end portions of the fingers 74 of the back plate 70. The threaded parts 45a of the bolts 45 are completely exposed above the pad 78. The combined back plate 70 and bolts 45 is attached below the motherboard 50. The bolts 45 are extended through the first through apertures 52 of the motherboard 50. The combined heat sink 10, standoffs 20 and springs 40 is then attached to the motherboard 50. The threaded parts 45a of the bolts 45 are extended through the expandable portions 28 into the guiding portions 31 of the standoffs 20. The bolts 45 are thus guided by the guiding portions 31 to enter the threaded portions 33 of the standoffs 20. The standoffs 20 are then threaded downwardly to cause the threaded portions 33 to engage with the threaded parts 45a of the bolts 45. The springs 40 are compressed to thereby firmly press the heat sink 10 onto the CPU 60.

In the present invention, the expandable portions 28 and the guiding portions 31 of the standoffs 20 facilitate easy and accurate engagement of the bolts 45 with the threaded portions 33 of the standoffs 20. This accordingly facilitates engagement of the bolts 45 in the standoffs 20. In addition, the pad 78 electrically isolates the back plate 70 from the motherboard 50, and prevents the back plate 70 from damaging the motherboard 50.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An electronic device assembly comprising:
   a motherboard having an electronic device mounted thereon, the motherboard defining a plurality of first through apertures;
   a back plate attached below the motherboard; and
   a heat sink assembly attached to the motherboard, the heat sink assembly comprising:
      a heat sink comprising a base defining a plurality of second through apertures;
      a plurality of bolts respectively extending through the back plate and the first through apertures of the motherboard;
      a plurality of standoffs each comprising a body extending through a corresponding second through aperture, and a head formed on a top end of the body, the body comprising a hollow part spanning middle and bottom portions thereof, the hollow part comprising a smooth guiding portion for guiding a corresponding bolt in the body and a threaded portion located above the smooth guiding portion and engaging with the corresponding bolt; and
      a plurality of springs compressed between the heads of the standoffs and the base to thereby firmly press the heat sink onto the electronic device.

2. The electronic device assembly as claimed in claim 1, wherein the heat sink further comprises a plurality of fins extending upwardly from the base.

3. The electronic device assembly as claimed in claim 1, further comprising a pad attached on the back plate for preventing the back plate from damaging the motherboard and electrically isolating the back plate from the motherboard.

4. The electronic device assembly as claimed in claim 1, wherein the hollow part further comprises an expandable portion located below the smooth guiding portion.

5. The electronic device assembly as claimed in claim 1, wherein each of the bolts comprises an upper threaded part engaging in the corresponding threaded portion.

6. The electronic device assembly as claimed in claim 1, wherein the back plate comprises a central portion and a plurality of fingers extending from the central portion.

7. The electronic device assembly as claimed in claim 6, wherein the central portion of the back plate defines an opening therein for improving elastic deformability of the back plate and reducing a weight of the back plate.

8. A method for securing a heat sink to a motherboard having an electronic device attached thereon, the motherboard defining a plurality of first through apertures, a back plate being attached below the motherboard, a plurality of bolts extending upwardly through the back plate and the first through apertures of the motherboard, the method comprising the steps of:
   a) providing a heat sink defining a plurality of second through apertures;
   b) providing a plurality of standoffs, each of the standoffs comprising a head and a body, the body comprising an expandable portion, a smooth guiding portion above the expandable portion and a threaded portion above the smooth guiding portion;
   c) providing a plurality of springs;
   d) placing the springs over the bodies of the standoffs;
   e) extending the bodies through the second through apertures such that the springs are located between the heads and heat sink;
   f) expanding the expandable portions to thereby combine the heat sink, the standoffs and the springs into a single unit;
   g) attaching the combined heat sink, standoffs and springs to the motherboard such that the bolts extend through the expandable portions to the smooth guiding portions, thereby guiding the bolts in the standoffs; and
   h) threading the standoffs to cause the bolts to engage in the threaded portions of the standoffs such that the springs are compressed to thereby firmly press the heat sink onto the electronic device.

9. The method as claimed in claim 8, wherein the heat sink comprises a base and a plurality of fins extending from the base, the second through apertures are defined in the base, and the springs are compressed between the heads and the base.

10. A heat sink assembly for an electronic device comprising:
    a heat sink comprising a base defining a plurality of through apertures and adapted for contacting the electronic device, and a plurality of fins extending upwardly from the base;
    a plurality of standoffs each comprising a body extending through a corresponding through aperture, and a head formed on a top end of the body, the body comprising a hollow part spanning middle and bottom portions thereof, the hollow part comprising an expandable portion in a bottom end thereof, a smooth guiding portion above the expandable portion for guiding a corresponding bolt in the body and a threaded portion located above the smooth guiding portion for engaging with the corresponding bolt; and
    a plurality of springs compressed between the heads of the standoffs and the base, wherein
    when the expandable portions are expanded outwardly the standoffs are securely attached to the heat sink and the base is sandwiched between the expandable portions and the springs.

11. The heat sink assembly as claimed in claim 10, wherein the expandable portion longitudinally defines a plurality of evenly-spaced slits in a wall of the hollow part.

12. The heat sink assembly as claimed in claim 10, wherein the threaded portion has an internal thread formed therein.

13. A heat sink assembly comprising:

a heat sink comprising a base with a plurality of through apertures therein and a plurality of fins thereon;

a plurality of hollow standoffs extending through said through apertures, respectively;

a plurality of springs located on exteriors of the corresponding standoffs, respectively;

expandable portions formed on bottom portions of the standoffs, respectively; wherein said expandable portions are outwardly expanded after downwardly inserted into and through the corresponding through apertures to have the base retainably sandwiched between the expandable portions and the corresponding springs.

14. The assembly as claimed in claim 13, further including under the heat sink a printed circuit board with a chip thereon and a plurality of through holes therein, a plurality of bolts upwardly extending through the corresponding through holes and through apertures and further retainably into the corresponding standoffs, respectively, wherein the base is tightly seated upon the chip with the expandable portions suspended between the printed circuit board and the base.

15. The assembly as claimed in claim 14, further including a back plate supportably under the printed circuit board opposite to said heat sink and with through openings through which the bolts extend, respectively.

16. The assembly as claimed in claim 14, wherein the standoffs and the corresponding bolts are fastened to each other via internal threads in the hollow standoffs and external threads on the bolts.

* * * * *